US005262977A

United States Patent [19]

Mitsutsuka

[11] Patent Number: 5,262,977

[45] Date of Patent: Nov. 16, 1993

[54] SURFACE ACOUSTIC WAVE CONVOLVER

[75] Inventor: Syuichi Mitsutsuka, Kooriyama, Japan

[73] Assignee: Clarion Co., Ltd., Tokyo, Japan

[21] Appl. No.: 827,180

[22] Filed: Jan. 28, 1992

[30] Foreign Application Priority Data

Jan. 31, 1991 [JP] Japan .................................. 3-031633

[51] Int. Cl.[5] ......................... G06G 7/195; H03H 9/25

[52] U.S. Cl. ................................ 364/821; 310/313 R; 333/150; 375/1

[58] Field of Search ..................... 364/821; 310/313 R; 333/150, 193; 357/26; 375/1

[56] References Cited

U.S. PATENT DOCUMENTS

| | | | |
|---|---|---|---|
| 3,809,931 | 5/1974 | White et al. | 310/313 R |
| 4,342,971 | 8/1982 | Councilman et al. | 333/150 X |
| 4,639,697 | 1/1987 | Yarranton et al. | 333/193 X |
| 4,691,326 | 9/1987 | Tsuchiya | 375/1 |
| 4,967,113 | 10/1990 | Mitsutsuka | 364/821 X |

*Primary Examiner*—Gilberto Barron, Jr.
*Attorney, Agent, or Firm*—Thomas R. Morrison

[57] ABSTRACT

A convolver has a piezoelectric film layer, an insulator layer and a semi-conductor layer. A surface resistance measurement part permits measurement of a surface resistance related to the surface resistance seen by a gate electrode of the convolver. The surface resistance part is changeable by a bias voltage applied to the convolver. The amplitude of the bias voltage is controlled to set the surface resistance at a value which produces a desired convolution efficiency of the convolver. The convolver is adaptable to be fabricated as an integrated circuit with a simple structure. A transmitter/receiver system is disclosed in which a transmitted SSC signal is modulated by a pseudo-noise (PN) signal, as well as by a normal modulation. In the receiver, the PN component of the signal is removed using a convolver according to the present invention, to correlate the received signal before detection thereof.

9 Claims, 14 Drawing Sheets

SURFACE ACOUSTIC WAVE CONVOLVER

BACKGROUND OF THE INVENTION

The present invention relates to a SAW (Surface Acoustic Wave) convolver having a multi-layer structure consisting of a piezoelectric layer, insulator layer and a semi-conductor layer constituted to be arranged along a vertical direction, more particularly to such convolver in which an electrical bias voltage for the desired convolution efficiency therefore, can be easily obtained.

Conventionally, there has been known a bias circuit for applying bias voltage to a convolver, such as shown in FIGS. 1 and 2. For example, principle of the circuit shown in FIG. 1 has been already disclosed in Japanese Patent Provisional Publication SHO 63-52509 and SHO 6377177, while, principle of the circuit in FIG. 2 has been already disclosed in Japanese Patent Provisional Publication HEI 2-69013.

FIGS. 3 through 5 show structure of a convolver 1 to which bias voltage is to be applied from these bias circuits, principle of such a convolver has been already disclosed in Japanese Patent Provisional Publication SHO 63-62281. FIG. 3 shows a perspective view of the convolver 1 and FIGS. 4 and 5 respectively show sectional views of the convolver 1. In FIG. 4, a semi-conductor layer 19 comprises two layers arranged to be overlapped with each other, that is, a low-concentration semi-conductor epitaxial layer 21 and a high-concentration semi-conductor substrate 22. On the other hand, in FIG. 5, a bulk substrate is used as the semi-conductor layer 19. Both of these two constitutions of the semi-conductor layer 19 can be employed in the convolver 1. In practical use, the constitution shown in FIG. 5 is mainly employed since higher convolution efficiency can be obtained by means of the constitution of FIG. 5 as compared with the case in which the constitution shown in FIG. 4 is employed.

In the drawings of FIGS. 3 through 5, numeral 2 indicates a gate electrode formed on a piezoelectric film 17, two pairs of numerals 3, 3 indicate input terminals through which input signal is applied to the convolver 1 and numeral 4 indicates an output terminal through which output signal is taken out therefrom. Further, a pair of numerals 16, 16 indicate comb-shaped electrodes formed on the piezoelectric film 17, numeral 18 indicates an insulator layer for electrically insulating the piezoelectric layer 17 and the semi-conductor layer 19, and numeral 20 indicates a reverse side electrode provided at the opposite surface of the semi-conductor layer 19 to the surface on which the piezoelectric layer 18 is provided.

An operation of the conventional bias circuit will be described hereinafter with reference to the drawings of FIGS. 1 through 5.

In the circuit diagrams shown in FIGS. 1 and 2, characters "A" and "B" respectively indicate bias circuits arranged to be connected to the convolver 1 through a pair of connection terminals "a" and "b". Numeral 5 indicates an output matching circuit for taking impedance matching between the convolver 1 and a not-shown circuit to be connected thereto through the output terminal 4, numeral 6 indicates an oscillator for generating an AC (Alternating Current) signal at the desired frequency "f", numeral 7 indicates an amplifier for amplifying signal from a impedance bridge circuit, described later, numeral 8 indicates a differential amplifier arranged to output signal corresponding to difference of each input signals inputted to a pair of terminals 8-1 and 8-2 of the differential amplifier 8.

In the circuit "A" shown in FIG. 1, numeral 9 indicates a phase detector for detecting phase of the output signal from the amplifier 7 by comparing the phase of the signal with phase of the signal from the differential amplifier 8. The output signal from the differential amplifier 8 is fed to the phase detector 9 as a reference signal, as shown in FIG. 1. The phase detector 9 is further arranged to output signal corresponding to the phase of the signal from the amplifier 7. Numeral 10 indicates a DC (Direct Current) amplifier for amplifying signal from the phase detector 9 and numeral 11 indicates integrating circuit for integrating output signal from the DC amplifier 10.

In the circuit "B" shown in FIG. 2, numerals 12, 12 respectively indicate a wave-form shaping circuit for shaping wave form of signal from the amplifiers 7, 7, numeral 13 indicates phase comparator for comparing the phases of the signals from the wave-form shaping circuits 12, 12 and generating signal corresponding to the difference of the compared phases.

Numeral 14 indicates a charge pump circuit and numeral 15 indicates a low pass filter circuit respectively for generating signal corresponding to the output signal from the comparator 13.

In the circuits shown in FIGS. 1 and 2, an impedance bridge comprises a plurality of impedance units. Characters "Za, Zb, Zc, Zd and Zl" indicate fixed impedances having predetermined values, character "Zr" indicates a reference impedance. Character "Cc" in FIG. 2 indicates a capacitor for DC cut-off, and character "L" indicates a coil having a predetermined inductance.

Both of bias circuits "A" and "B" shown in FIGS. 1 and 2 are employable for applying bias voltage to the convolver 1. In this type of convolver 1, convolution efficiency "Ft" is changed in accordance with value of gate capacitance "C" generated between the gate 2 and the ground. The bias circuit, such as "A" or "B", is arranged to change the gate capacitance "C", therefore, the gate capacitance "C" is controlled so as to be fixed at desired value, for example "Cop".

In the bias circuits "A" and "B", value of "Zr" is arranged to be slightly variable. When the gate value "C" is to be changed, "Zr" is fixed at a certain value and the frequency "f" of the oscillator 6 is changed. As a result, the gate capacitance value "C" is determined at the desired "Cop", and then, convolution efficiency "Ft" corresponding to the "Cop" is obtained. In other words, by changing the value of the gate capacitance "C", the convolution efficiency "Ft" is changed.

FIG. 6 shows one example of a characteristic diagram, in a so-called ZnO/SiO2/n-Si structure type convolver, showing relations between the bias voltage "V" and the gate capacitance "C" as well as the convolution efficiency "Ft". The horizontal axis indicates variation of the bias voltage "V" and the vertical axis indicates variations of the gate capacitance "C" and the convolution efficiency "Ft". The gate capacitance "C" is indicated in relative representation. That is, the numeral "1" in a "C"-axis indicates capacitance under the condition that the bias voltage "V" is made sufficiently large. The capacitance "C" changes between "Cmax." and "Cmin.", as the gate voltage changes between an inversion region and a storage region through a sub threshold region and a depletion region. The C-V characteristic curve and Ft-V characteristic curve are indicated in this diagram. As the bias voltage "V" changes, i.e., the condition of the convolver is shifted between the inversion region and the storage region, the gate capacitance "C" and the convolution efficiency "Ft" are changed as shown in the diagram. As clearly shown in the diagram of FIG. 6, it is possible to set the gate capacitor "C" at "Cop" by setting the bias voltage "V" at "Vo", thereby setting the convolution efficiency "Ft" at the maximum value "Ftmax".

In this type of convolver, i.e., a piezoelectric film(-Zno)insulator(SiO2)/semi-conductor(n-Si) structure type SAW convolver, electric charges can be injected into or released from the piezoelectric film layer. As a result, the C-V characteristic curve in the diagram of FIG. 6 shifts along the horizontal axis, i.e., the bias voltage axis, in accordance with an amount of the electric charge stored in the piezoelectric film layer. The Ft-V characteristic curve also shifts along the horizontal axis in a manner similar to the shift of the C-V characteristic curve. In other words, these characteristic curves simultaneously shift along the horizontal axis (the bias voltage axis) in accordance with the amount of electric charge stored in the piezoelectric film layer. Therefore, the value "Cop" corresponding to the "Ftmax" is fixed at constant value regardless of the variation of the amount of the electric charge.

As described above, by employing the bias circuit such as "A" and "B" shown in FIGS. 1 and 2, it is possible to maintain the convolution efficiency of the convolver at the maximum value "Ftmax" regardless of the amount of stored electric charge.

The above types of bias circuits exhibit the disadvantages described below.

First, in these types of bias circuit, it is necessary to detect the existing value of the gate capacitance "C" and then to set it at the desired value such as "Cop". As a consequence several types of electrical units such as oscillator, impedance bridge, phase detector, phase comparator are required. In order to detect the value of the gate capacitance "C", it is necessary to provide an oscillator 6 for generating an AC voltage to be applied to the gate electrode, and an impedance bridge. In order to set the gate capacitance "C" at the desired value, a phase detector 9, shown in FIG. 1, or a phase comparator, shown in FIG. 2, is required. Therefore, these circuits are complicated to use and they consume a large amount of electric power.

Secondly in these types of bias circuits, since an oscillator injects an AC signal, the output signal from the convolver is modulated by the AC signal. If amplitude of the AC signal is reduced, the amount of AC modulation in the output is also reduced. However, in this case, the overall feed back gain of the bias circuit must be increased for an appropriate detection of the gate capacitor "C". As a result of the high feed back gain, the bias circuit is liable to generate undesirable electrical oscillations.

Finally, these types of bias circuits include components which are not suitable for fabrication as part of a solid state integrated circuit. For example, the coil "L" in the bias circuit "B" shown in FIG. 2 is not conveniently included in an integrated circuit. As described previously, these circuits become complicated and their power consumption is high. Therefore, these circuits are not suitable for solid state implementation and miniaturization.

OBJECTS AND SUMMARY OF THE INVENTION

It is therefore an object of the present invention to provide a SAW convolver capable of obtaining the desired convolution efficiency which has a simple structure.

For this purpose, according to the present invention, there is provided a convolver comprising a structure having a piezoelectric film layer, an insulator layer and a semi-conductor layer;

said convolver further comprising a surface resistance measurement part whose electric resistance is arranged to be measured, said surface resistance measurement part being located below a predetermined part on said piezoelectric film layer, whose electric potential is similar to that of a gate electrode of said convolver.

It is another object of the present invention to provide a bias circuit, suitable for solid state implementation and miniaturization, for applying a desired bias voltage to the gate electrode of the convolver.

For this purpose, according to the present invention, there is provided a bias circuit for a convolver comprising:

a convolver comprising a structure having a piezoelectric film layer, an insulator layer and a semi-conductor layer;

a surface resistance measurement part arranged to be located below a predetermined part whose electric potential is similar to that of a gate of said convolver, the resistance value of said surface resistance measurement part being changeable in accordance with bias voltage applied thereto;

a resistance comparing circuit for comparing the resistance value of said surface resistance measurement part and a reference resistance having desired value; and a bias generating circuit for generating said bias voltage based upon the compared values by said resistance comparing circuit;

whereby the resistance value of said surface resistance measurement part is set at the desired value.

It is still another object of the present invention to provide a SSC (Spread Spectrum Communication) system employing a SAW convolver which is arranged in such a manner that the desired convolution efficiency therefor is obtained with a simple structure.

Briefly stated, the present invention provides a convolver that has a piezoelectric film layer, an insulator layer and a semi-conductor layer. A surface resistance measurement part permits measurement of a surface resistance related to the surface resistance seen by a gate electrode of the convolver. The surface resistance part is changeable by a bias voltage applied to the convolver. The amplitude of the bias voltage is controlled to set the surface resistance at a value which produces a desired convolution efficiency of the convolver. The convolver is adaptable to be fabricated as an integrated circuit with a simple structure. A transmitter/receiver system is disclosed in which a transmitted SSC signal is modulated by a pseudo-noise (PN) signal, as well as by a normal modulation. In the receiver, the PN component of the signal is removed using a convolver according to the present invention, to correlate the received signal before detection thereof.

For this purpose, according to the present invention, there is provided a spread spectrum communication system comprising:

an RF generator for generating an RF signal to be transmitted;

a PN signal generator for generating a predetermined PN signal; and a modulator for modulating the RF signal generated by said RF generator, by means of the PN signal generated by said PN signal generator, said RF generator, said PN signal generator and said modulator being provided in a transmitter;

a reference signal generator for generating a reference signal having a predetermined relationship to the PN signal generated by said PN signal generator;

a convolver comprising a structure having a piezoelectric film layer, an insulator layer and a semi-conductor layer, a surface resistance measurement part whose electric resistance is arranged to be measured, said surface resistance measurement part being located below a predetermined part whose electric potential is similar to that of a gate electrode of said convolver, the PN signal modulating the RF signal and the reference signal generated by said reference signal generator being correlated by said convolver;

a demodulator for demodulating the RF signal in accordance with correlation executed by said convolver; and said reference signal generator and said convolver being provided in a receiver.

According to an embodiment of the invention, there is provided a convolver comprising: a piezoelectric film layer, an insulating layer affixed to the piezoelectric film layer, a semi-conductor layer affixed to the insulating layer, a gate electrode on the piezoelectric film layer, a surface resistance measurement part, and means for permitting the surface resistance measurement part to have a surface resistance related to a condition of the piezoelectric film layer.

According to a feature of the invention, there is provided apparatus comprising: a convolver, the convolver including a piezoelectric film layer, an insulator layer, a semiconductor layer, and a gate, a surface resistance measurement part in the convolver located close to a part of the convolver having an electric potential similar to the gate, means for making a resistance value of the surface resistance measurement part being changeable by a bias voltage applied thereto, a resistance comparing circuit for comparing resistance value of the surface resistance measurement part and a reference resistance, and a bias generating circuit, responsive to the resistance comparing circuit, for generating the bias voltage, and means for controlling the bias voltage to a value effective for setting a surface resistance value of the surface resistance measurement part to a desired value.

According to a further feature of the invention, there is provided a spread spectrum communication system comprising: a transmitter, an RF generator in the transmitter for generating RF signal to be transmitted, a PN signal generator in the transmitter for generating a predetermined PN signal, a modulator in the transmitter for modulating the RF with the PN signal to produce a transmitted signal, a receiver for receiving the transmitted signal to produce a received signal, a reference signal generator in the receiver for generating a reference signal having a predetermined relation with the PN signal, a convolver, the convolver including means, responsive to the received signal and the reverence signal, for correlating the RF signal in the received signal, a demodulator for demodulating the RF signal from the convolver, the convolver including a piezoelectric film layer, an insulator layer, a semi-conductor layer and a gate, a surface resistance measurement part in the convolver, means for permitting measurement of an electric resistance of the surface resistance measurement part, the surface resistance measurement part being located relative to a predetermined part of the convolver to provide an electrical resistance related to a surface resistance at the gate, and means, responsive to a resistance of the electrical resistance, to control a bias of the convolver to a predetermined value.

According to a further feature of the invention, there is provided a convolver comprising: a piezoelectric layer, means for propagating a SAW in said piezoelectric layer, means for measuring a surface resistance in said piezoelectric layer, and means, responsive to said surface resistance, for controlling a bias applied to said convolver to a value effective to produce a predetermined value of convolution efficiency.

The above, and other objects, features and advantages of the present invention will become apparent from the following description read in conjunction with the accompanying drawings, in which like reference numerals designate the same elements.

DETAILED DESCRIPTION OF THE PREFERRED EMBODIMENTS

Figure 7:
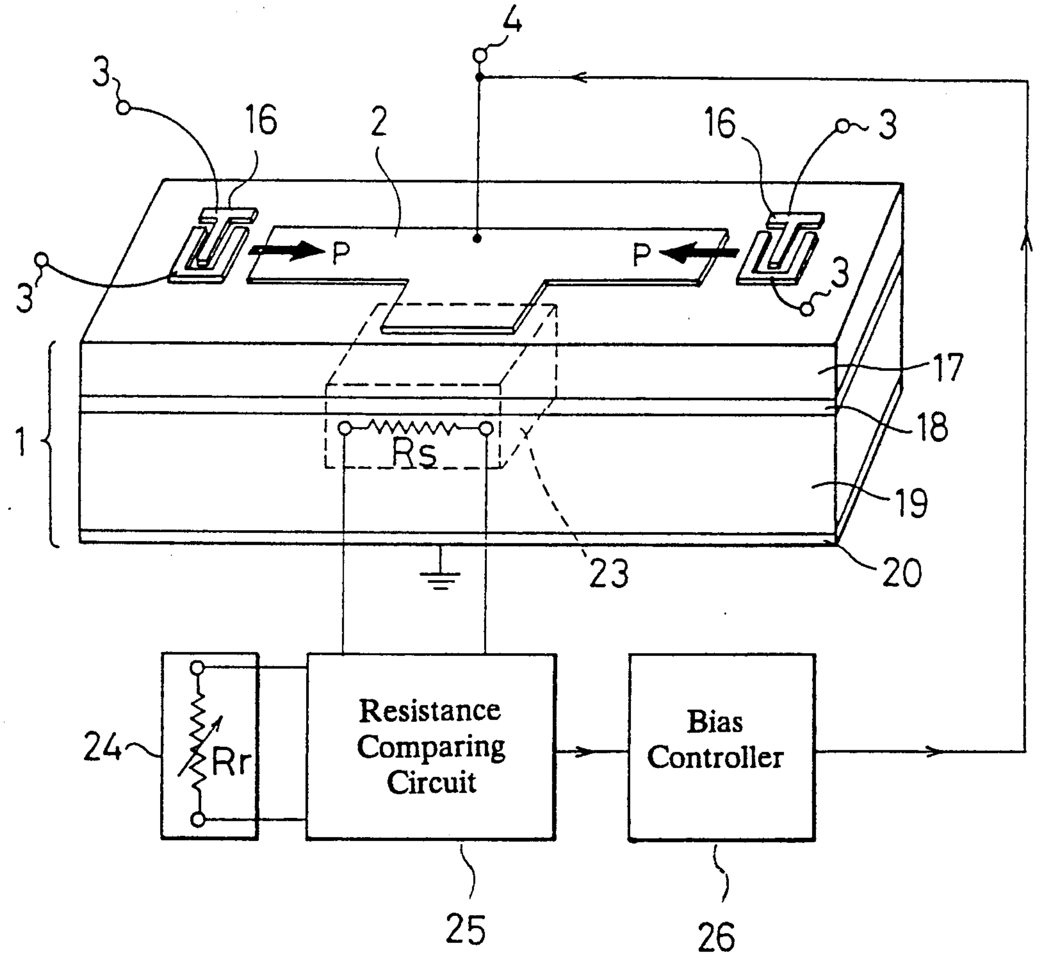
FIG. 7 shows a perspective view of a SAW convolver and a block diagram of its bias circuit, showing the relation between the convolver having a surface resistance measurement part therein and the bias circuit for applying bias voltage thereto, respectively according to the present invention.

Referring to FIG. 7, a SAW convolver having the ZnO/SiO2/n-Si structure having a gate electrode 2, two pairs input terminals 3, 3 and an output terminal 4 on a piezoelectric film layer 17. Two comb-shaped electrodes 16, 16 on piezoelectric film layer 17 receive input signals from their respective input terminals 3, 3. An insulating layer 18 is disposed below piezoelectric film layer 17. A semi-conductor layer 19 is affixed below insulating layer 18. A reverse side electrode 20 covers the bottom of the stack described above.

Signal input at input terminals 3, 3 are propagated along the surface of piezoelectric film layer 17 on a path indicated by a pair of arrows "P, P".

A surface resistance measurement part 23 in semi-conductor layer 19 permits measurement of the "surface resistance of semi-conductor". The "surface resistance of semi-conductor" is defined as the surface resistance "Rs" between the semi-conductor layer 19 and the insulator layer 18 in a horizontal direction. This definition is employed in following description.

The surface resistance measurement part 23 is provided within the semi-conductor layer 19 and below the gate electrode 2.

Figure 8:
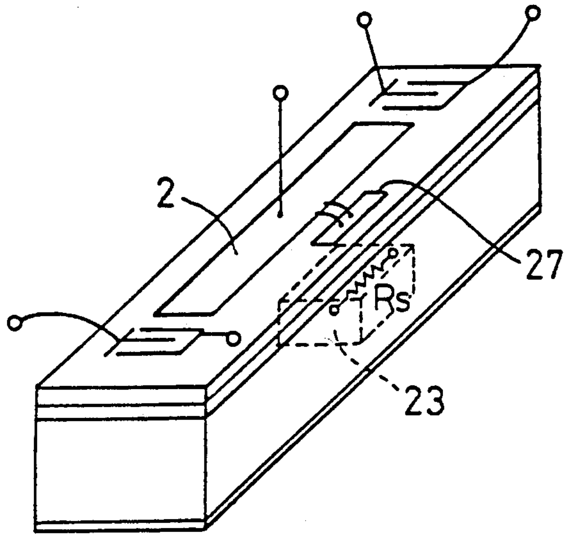
FIG. 8 shows a perspective view of another convolver having the surface resistance measurement part according to the present invention.

Referring now to FIG. 8, instead of situating the surface measurement part below gate electrode 2, it may be disposed outside the path P—P below an electrode member 27 that is electrically connected to the gate electrode 2. The arrangement of FIG. 8, reduces the affect on signal propagation on path P—P due to the presence of the surface resistance measurement part 23.

In the drawing of FIG. 7, the value of the surface resistance "Rs" is changed by a bias voltage applied from a bias controller 26, described later. The value of surface resistance "Rs" is compared with a reference resistance 24 in a resistance comparing circuit 25 to produce an appropriate bias voltage. The bias voltage is applied to the gate electrode 2 from the bias controller 26 at an amplitude effective to adjust the value of the surface resistance "Rs" to the desired value. In other words, the bias voltage applied to the gate electrode 2 is controlled by the bias controller 26.

As described previously, it is possible to provide a surface resistance measurement part 23 below another electrode member 27 whose potential is similar to that of the gate electrode 2 as shown in FIG. 8. Further, as shown in FIG. 9, it is possible to provide a plurality of measurement parts 23, three parts in this case, in order to determine surface resistance "Rs" over any desired portion of the length of electrode of semi-conductor layer 19.

Figure 9:
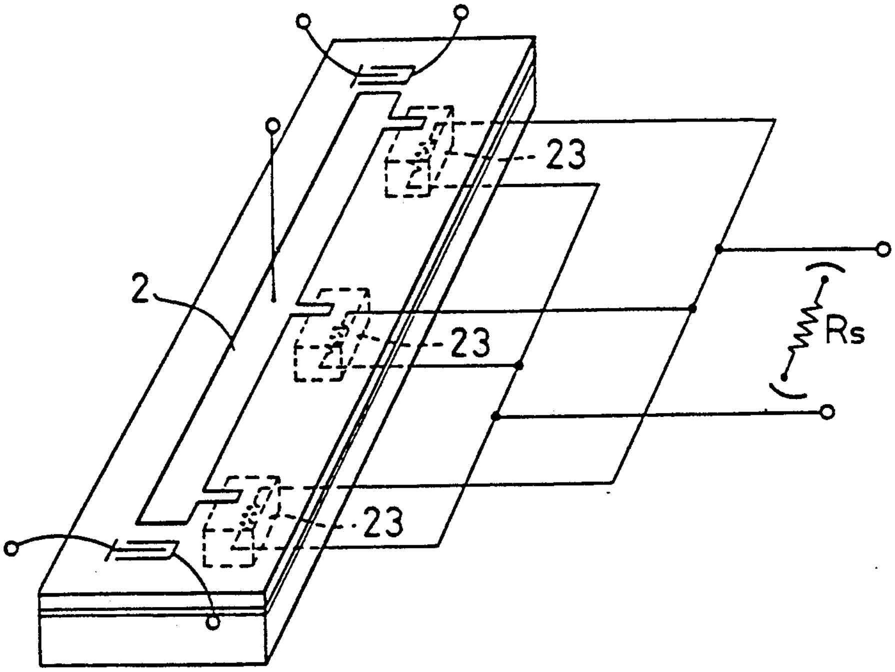
FIG. 9 shows a perspective view of still another convolver according to the present invention.

If the surface resistance measurement part 23 is provided below the gate electrode 2, it is preferable to make the gate electrode 2 project from the propagation path P—P of the signal, and to locate the surface resistance measurement part 23 below the projecting part, as shown in FIGS. 7 and 9, for minimizing the effect on the signal propagation due to the presence of surface resistance measurement part 23.

Figure 10:
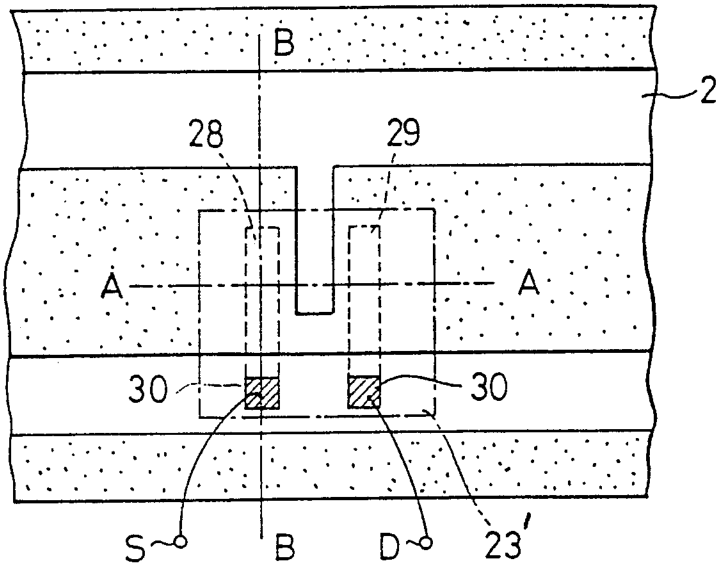
FIG. 10 shows a top view of a portion of a convolver according to the present invention in which a FET (Field Effect Transistor) is provided as a surface resistance measurement part.

FIG. 10 shows a partial top view of convolver according to another embodiment of the present invention in which the surface resistance "Rs" appears as a resistance between a source 28 and a drain 29 of a MISFET 23' (Metal-Insulator Semi-conductor FET). In this embodiment of the invention, the MISFET 23' is used as the surface resistance measurement part.

Figure 11:
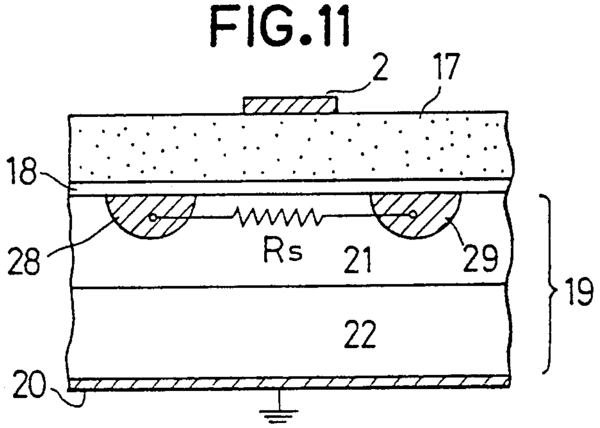
FIGS. 11 and 12 respectively show partial sectional views of the convolver shown in FIG. 10.

FIG. 11 shows a partial sectional view of the convolver taken along "A—A" in FIG. 10.

Figure 12:
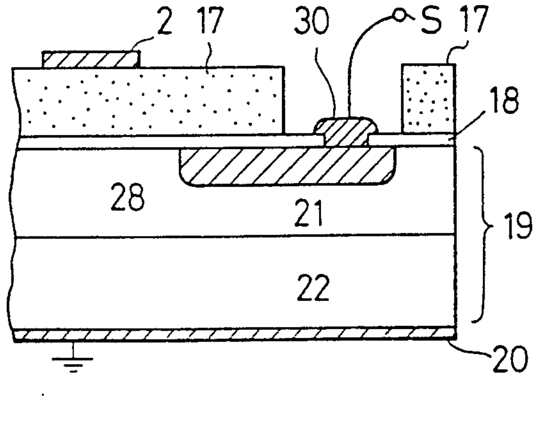

FIG. 12 shows another partial sectional view taken along "B—B" in FIG. 10.

In the convolver shown in FIGS. 10 through 12, a part of the gate electrode 2 of the convolver is the gate of the MISFET 23'. Terminal electrodes 30, 30 are connected respectively to the source 28 and the drain 29 of MISFET 23'. The source 28 and the drain 29 are formed on a boundary area between the insulator layer 18 and the semi-conductor layer 19 as shown in FIGS. 11 and 12. In this arrangement, the gate of the MISFET 23' is formed as a part of the gate electrode 2 of the convolver. It is possible to provide another electrode such as electrode member 27 in FIG. 8 whose electric potential is similar to that of the gate electrode 2.

Figure 4:
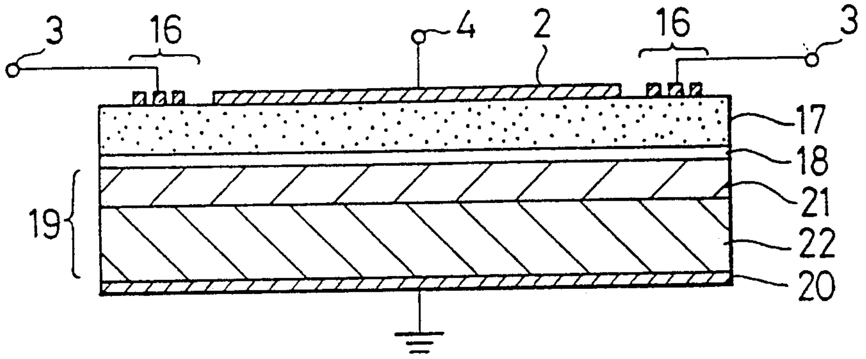
FIG.4 Prior Art
FIGS. 4 and 5 respectively show sectional views of the convolver shown in FIG. 3.
Figure 5:
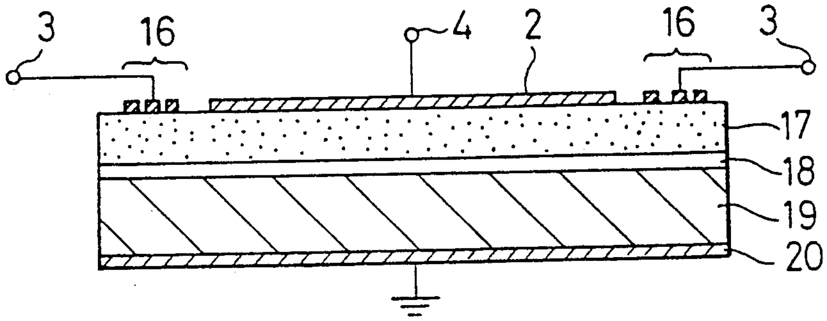
FIG.5 Prior Art

In the arrangement shown in FIGS. 10 through 12, the source 28 and the drain 29 of MISFET 23' are formed of high concentration semi-conductor material whose conduction type is complementary with that of the semi-conductor layer 19. For example, when the conduction type of the semi-conductor layer 19 is N-type, the source 28 as well as the drain 29 are P-type high concentration semi-conductor. On the contrary, when the type of the semi-conductor layer 19 is P-type, the source 28, drain 29 are formed as the N-type high-concentration semi-conductor. Further, in the drawings of FIGS. 10 through 12, semi-conductor layer 19 is a low concentration semi-conductor epitaxial layer 21 on a high-concentration semi-conductor substrate 22. As shown in the prior-art embodiment of FIGS. 4 and 5, however, it is possible to replace the two layers of semi-conductor layer 19 and epitaxial layer 21 (FIG. 4) with a single bulk substrate consisting of the semi-conductor layer 19 (FIG. 5).

The terminal electrodes 30, 30 may be made of any suitable material such as, for example, a metal or a high concentration semi-conductor (for example, polysilicon) forming ohmic contact with the material of the source 28 and the drain 29. Characters "S" and "D" indicate source and drain terminals, respectively, connected to the terminal electrodes 30, 30.

In the embodiment of FIGS. 10 through 12, the condition of the semi-conductor layer 19 below the gate of the MISFET 23 is similar to that of the semi-conductor layer 19 below the gate electrode 2 of the convolver. That is, the gate of the MISFET 23 is a part of the gate electrode of the convolver 1. The surface resistance "Rs" of the MISFET is changed according to the gate voltage Vg applied to it, as shown in a characteristic diagram of FIG. 13. The logarithmic characteristic curve "X" in FIG. 13 qualitatively indicates the relationship between gate voltage "Vg" applied to the gate of the convolver and drain current "Id" flowing through the drain 29. The relationship represented by the curve "X" is satisfied when the source 28 of the MISFET 23 is grounded and the predetermined value of voltage is applied to the drain 29. The value of the surface resistance "Rs" varies in accordance with the variation of the drain current "Id". When the drain current "Id" becomes large, the surface resistance "Rs" is small. In other words, when the gate voltage "Vg" decreases, the surface resistance "Rs" becomes small.

Figure 13:
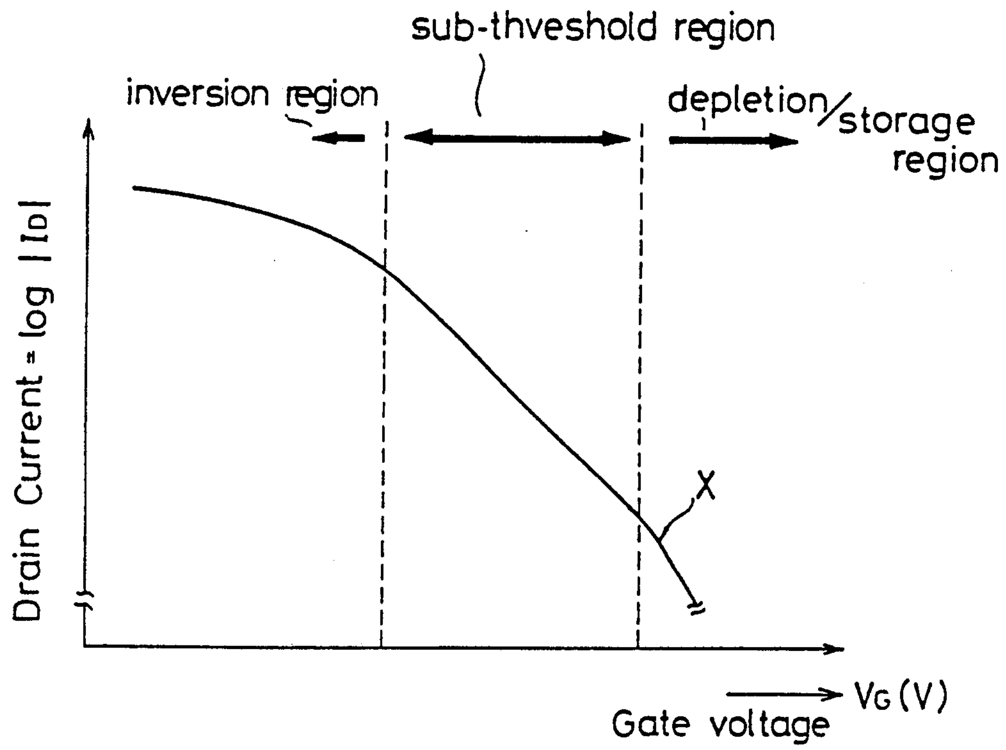
FIGS. 13 and 14 respectively show characteristic diagrams showing the relationship between gate voltage and drain current of the FET formed as the surface resistance measurement part.

In the diagram of FIG. 13, if the conduction type of the semi-conductor layer is N-type, the gate voltage for the MISFET is made positive. If the conduction type of the semi-conductor layer is P-type, the gate voltage "Vg" is made negative.

As clearly shown in FIG. 13, the surface resistance "Rs" of the MISFET continuously decreases as the gate voltage decreases. That is, when the condition of the semi-conductor layer is shifted from the storage region to the inversion region through the depletion region and the sub threshold region, the surface resistance "Rs" continuously decreases. This makes it possible to detect the condition of the semi-conductor layer below the gate electrode by measuring the value of the surface resistance "Rs".

Figure 6:
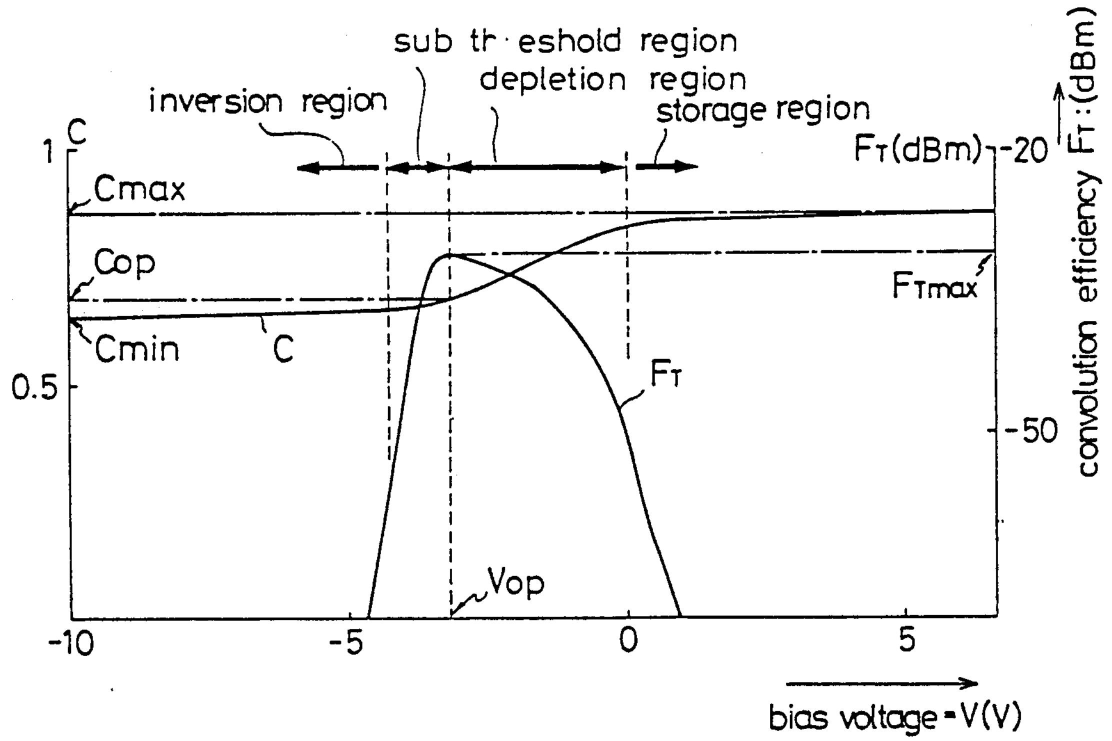
FIG. 6 shows a characteristic diagram showing relations between bias voltage and gate capacitance as well as convolution efficiency of the convolver.

As shown in FIG. 6, the convolution efficiency "Ft" is maximized when the condition of the semi-conductor layer 19 is shifted from the depletion region to the sub-threshold region.

The above described characteristic of the MISFET is completely described in "SEMICONDUCTOR DEVICES: Physics and Technology" written by S. M. Sze and published from John Wili and Sons, Inc. As fully described in the above document and qualitatively shown by the characteristic curve in FIG. 13, variation of the drain current "Id" is changed exponentially in the sub-threshold region in response to changes the gate voltage. Further, the absolute value of the drain current "Id" shown in the curve of FIG. 13, i.e., the drain current which flows through the drain of the convolver shown in FIGS. 10 through 12, is extremely small. That is the surface resistance "Rs" of the MISFET 23' shown in FIGS. 10 through 12 is large and the drain current "Id" changes sharply in response to variations of the gate voltage "Vg". As a result of the sensitivity of current to voltage, it is difficult to easily set the bias voltage "C" at the desired value, and it is difficult to adjust the convolution efficiency "Ft" to the desired value.

Further, if a leak current exists between the drain 29 and the reverse side electrode 20, such a leak current appears to the system as though the value of the surface resistance "Rs" is smaller than its actual value. In other words, since the leak current increases the total current, the portion of the current flowing through the drain 29 is difficult to detect accurately in the MISFET 23' shown in FIGS. 10 through 12.

Figure 15:
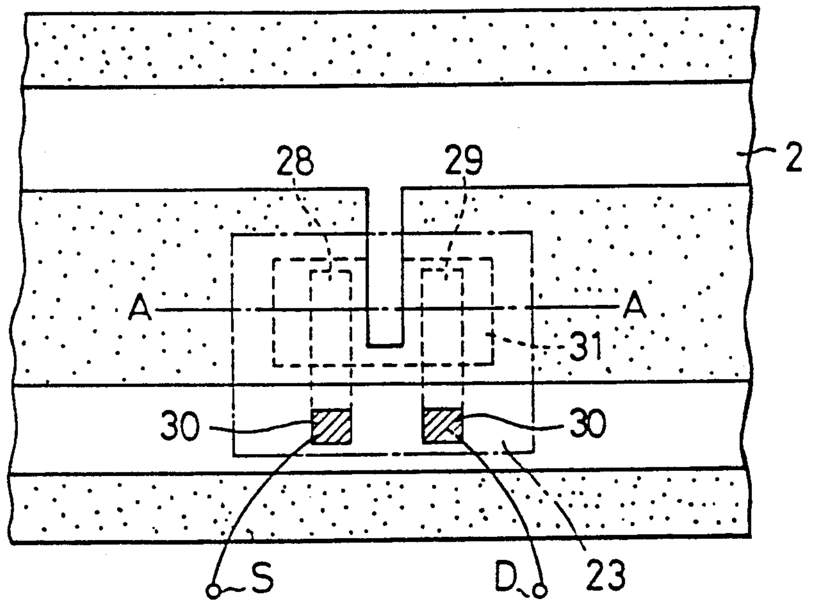
FIG. 15 shows a top view of the convolver of another embodiment of the present invention.
Figure 16:
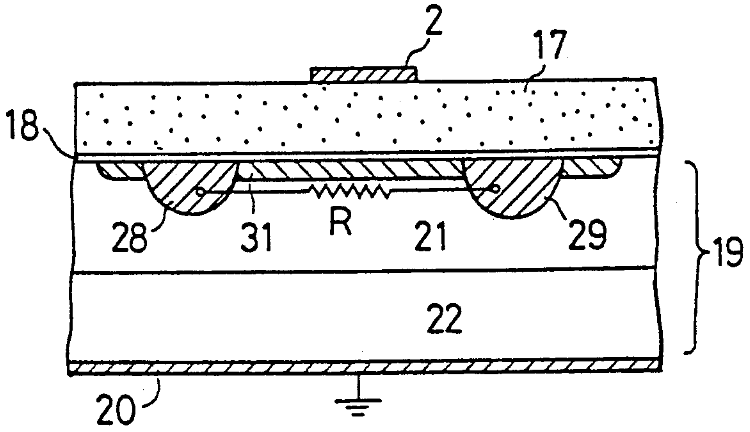
FIG. 16 shows a sectional view of the convolver shown in FIG. 15.

FIG. 15 shows a partial top view of a convolver according to a further embodiment of the present invention. FIG. 16 shows a partial sectional view of the convolver taken along "A—A" line in FIG. 15.

A thin low-concentration semi-conductor layer 31 is formed between the insulating layer 18 and the semi-conductor layer 19. The thickness of semi-conductor layer 31 is smaller than that of the semi-conductor layer 19, i.e., several thousand Angstroms. The conduction type of the layer 31 is complementary to the conductivity type of the semi-conductor layer 19. That is, if the conduction type of the semi-conductor layer 19 is N-type, then semi-conductor layer 31 is arranged to be P-type.

Figure 14:
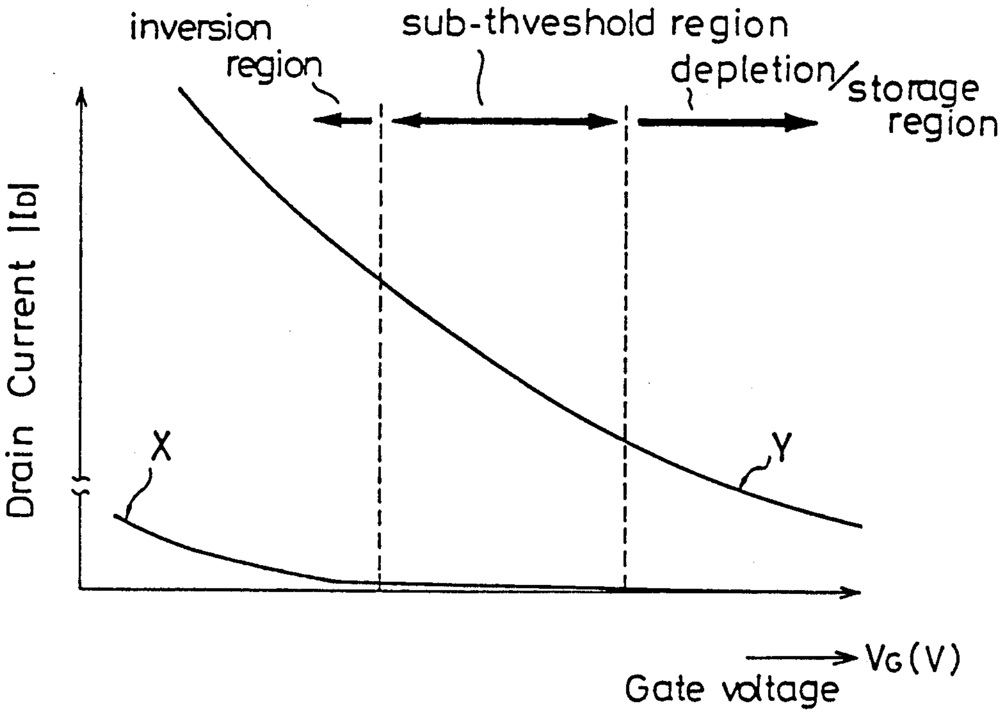

The semi-conductor layer 31 is formed by conventional doping of impurities using, for example, diffusion or ion implantation. A characteristic curve "Y", representing the relationship between the gate voltage "Vg" and the drain current "Id" in an arrangement shown in FIGS. 15 and 16, is indicated in FIG. 14. The characteristic curve "X" is also plotted on the linear scale for comparison. In this arrangement, the semi-conductor layer 19 in the convolver is the N-type material. In the diagram of FIG. 14, the vertical axis is represented in linear scale rather than the logarithmic scale that was used in FIG. 13. As in the device in FIGS. 10 through 12, the source 28 of the MISFET is grounded and a predetermined voltage is applied to the drain 29.

As clearly shown in the curve "Y" shown in FIG. 14, the drain current "Id" flowing through the drain 29 is large in an area between the sub threshold region and the depletion region, as compared with the curve "X" in FIG. 14. The more linear nature of the curve "Y" makes it easier to control the drain current than is the case with the curve "X".

In the arrangement of FIGS. 15 and 16, the semi-conductor layer 31 forms a surface current channel in which the drain current flows. Accordingly, even though the semi-conductor layer 19 below the gate electrode 2 of the convolver is kept at the sub-threshold region or the depletion region, the MISFET shown in FIGS. 15 and 16 is not kept in the sub-threshold region but, instead, is kept in the inversion region.

Accordingly, the value of the surface resistance "Rs" in the FIG. 15 arrangement is smaller than that of the FIG. 10 arrangement. Therefore, by employing the FIG. 15 arrangement, it is possible to avoid the effects of leak currents flowing between the drain 29 and the reverse side electrode 20.

Figure 17:
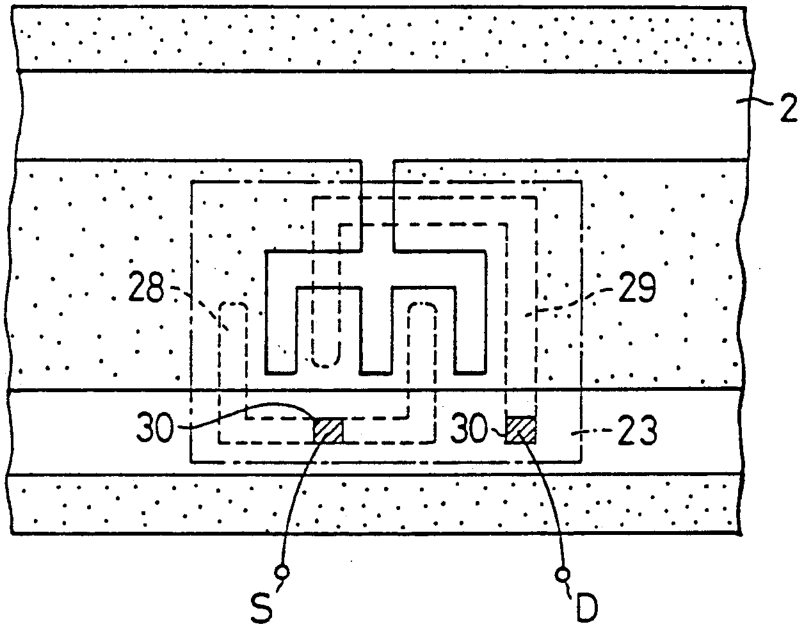
FIG. 17 shows a top view of the convolver of still another embodiment of the present invention.

FIG. 17 shows a partial top view of a convolver according to still another embodiment of the present invention. A plurality of MISFET elements are provided within the semi-conductor layer. In this type of arrangement, a vertical construction, such as shown in FIG. 11 or FIG. 16, may be employed. The use of a plurality of MISFET elements further increases the drain current. The higher drain current permits more accurate measurement of the value of surface resistance "Rs".

The source 28 and drain 29 in the above described arrangements can be formed by means of well-known manner such as, for example, diffusion or ion implantation.

Referring now to FIG. 7, the principle of controlling the bias voltage applied to the gate electrode 2 of the convolver 1 is described.

The surface resistance "Rs" is measured and controlled to the desired value "Rsop" by changing the bias voltage applied to the gate electrode 2 of the convolver 1. This controls the convolution efficiency "Ft" to the desired value. As described previously with reference to the drawings of FIGS. 13 and 14, when the condition of the semi-conductor layer below the gate electrode is changed from the storage region to the inversion region through the depletion region and the sub-threshold region, the value of the surface resistance "Rs" continuously decreases. Accordingly, if the surface resistance "Rs" is set at a predetermined value, the condition of the semi-conductor layer is determined.

As shown in FIG. 6, the convolution efficiency "Ft" attains its maximum value when the condition of the semi-conductor layer is between the sub-threshold region and the inversion region, and it is smaller in the other conditions. Therefore, the relationship between the surface resistance "Rs" and the convolution efficiency "Ft" is indicated qualitatively by a characteristic curve shown in FIG. 18. In order to set the convolution efficiency "Ft" at its maximum value "Ftmax", the bias voltage must be controlled so as to set the surface resistance "Rs" at the value "Rsop".

The resistance comparing circuit 25 compares the resistance values of the surface resistance "Rs" and the reference resistance "Rr". The bias controller 26 generates a voltage based upon the difference between the resistance values "Rs" and "Rr". The generated voltage from the bias controller 26 is applied to the gate electrode 2 of the convolver 1. The surface resistance "Rs" is controlled by the generated voltage to the desired value such as "Rsop" in FIG. 8. When the value of surface resistance "Rs" is set at "Rsop", the maximum convolution efficiency "Ftmax" is obtained. The reference resistance 24 may be variable as shown in order to permit controlling the convolution value "Ft" to some desired value other than the maximum value "Ftmax".

The surface resistance measurement part 23 may be different from that discussed in the preceding without departing from the spirit and scope of the invention as long as a value related to the surface resistance is determined from the condition of the semi-conductor layer.

With reference to drawings of FIG. 19A, principles of the resistance comparing circuit 25 and the bias controller 26 are described hereinafter.

A resistance "Ro" is connected in series between the surface resistance "Rs" and a DC voltage source "Vd". A resistance "Rb" is connected in series with a reference resistance "Rr" between a DC voltage source "Vr" and ground. Opposite ends of surface resistance "Rs" and reference resistance "Rr" are grounded. DC voltage sources "Vd" and "Vr" are set at the same predetermined value "Vo", so that an equation "Vr=Vd=Vo" is satisfied.

A "+" input terminal of a DC differential amplifier 32, simply referred as "Amp." hereinafter, is connected to a junction of "Rs" and "Ro". The "−" input terminal of Amp. 32 is connected to a junction of "Rr" and "Rb". An output of the Amp. 32 is connected to the gate electrode 2 of the convolver 1 through a resistance "Rm" or a coil "Lm". "Rm" and "Lm" are selected so as not to affect to an output matching circuit, not shown, of the convolver.

Figure 19A:
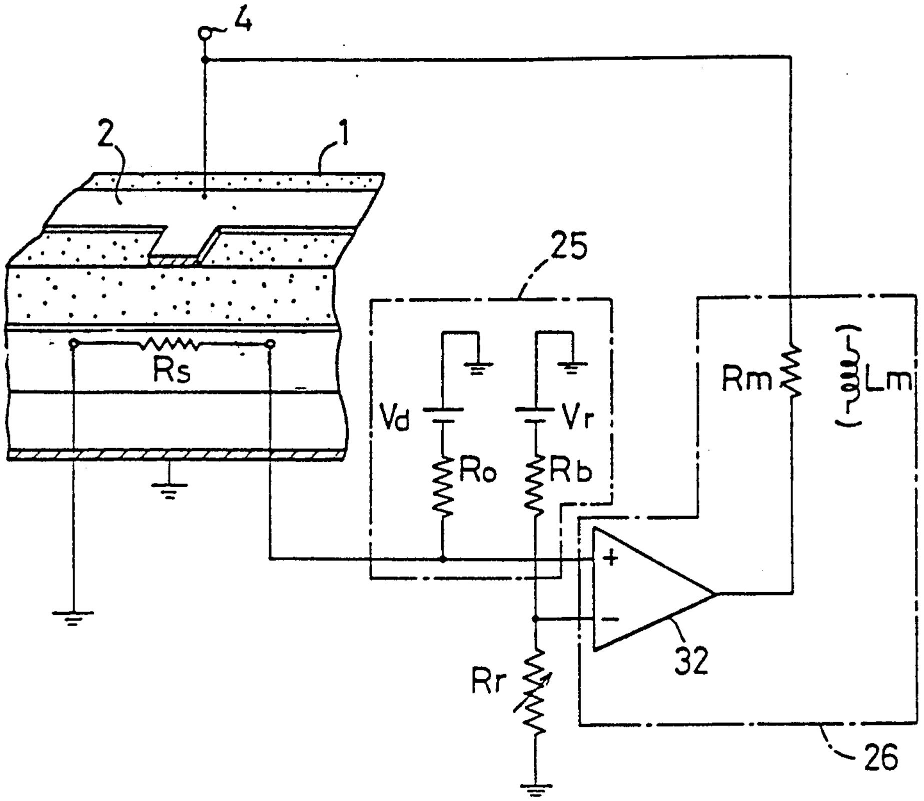
FIG. 19A shows a circuit diagram for explaining principle of the bias circuit of the present invention.

In the circuit shown in FIG. 19A, the resistance comparing circuit 25, for comparing the resistance value of surface resistance "Rs" and "Rr", comprises the elements "Ro, Rb, Vd, and Vr". The bias controller 26, for generating the bias voltage to be applied to the gate electrode 2 of the convolver 1, comprises the elements "Amp. and Rm or Lm". The Amp. 32 is arranged to output a voltage corresponding to the difference between the resistances of the surface resistance "Rs" and reference resistance "Rr".

In the Circuit shown in FIG. 19A, the value of the surface resistance "Rs" is defined by the following equation when the gain of the amplifier "Amp." is sufficiently large.

$$Rs=Rr[Ro\cdot(Vr/Vd)]/[Rb+\{1-(Vr/Vd)\}Rr] \qquad (1).$$

Figure 18:
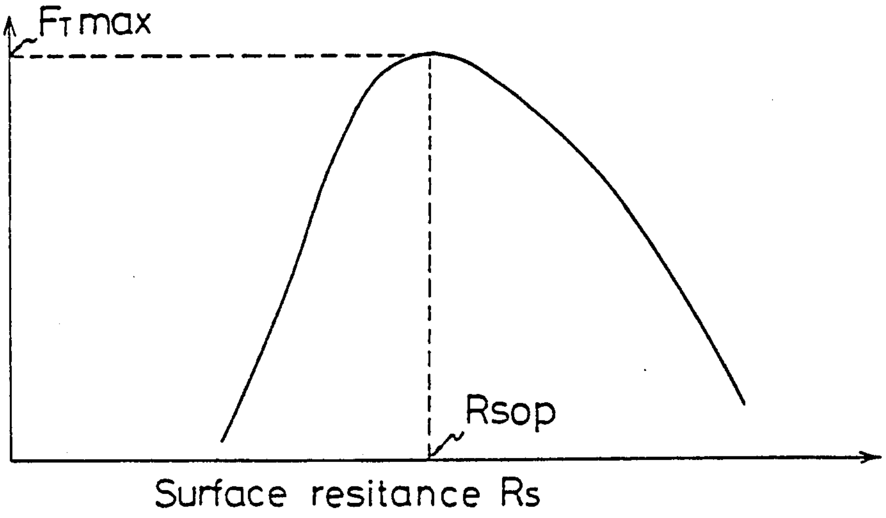
FIG. 18 shows a characteristic diagram showing the relation between the surface resistance and the convolution efficiency.

As clearly shown in the above equation (1), it is possible to control the value of the surface resistance "Rs" by adjusting the reference resistance "Rr". Thus, adjusting the value of the reference resistance "Rr" enables setting set the convolution efficiency "Ft" at any desired value such as, for example, the maximum value "Ftmax". When the surface resistance "Rs" is set at the value "Rsop" as shown in FIG. 18, the convolution efficiency "Ft" is maximized. In other words, when the value of reference resistance "Rr" is set to its best value, the value of the surface resistance "Rs" is set at the "Rsop" which produces the maximum convolution efficiency "Ftmax".

In the equation (1), the following equation is obtained when the values "Vd" and "Vr" are equal.

$$Rs=Rr(Ro/Rb) \qquad (2).$$

When the values "Vd" and "Vr" are equal as shown in the above equation (2), i.e., when the relationship "Vd=Vr=Vo (predetermined constant value)" is satisfied, the value of the surface resistance "Rs" is proportionally changed with the value of the reference resistor "Rr", and it has no relation with the voltage "Vo". Accordingly, it is possible to change the value of the surface resistance "Rs" without relationship to the value of voltages "Vd", "Vr", as long as these voltages are equal. Therefore, it is preferable to make the voltage "Vd, Vr" similar to each other.

Figure 19B:
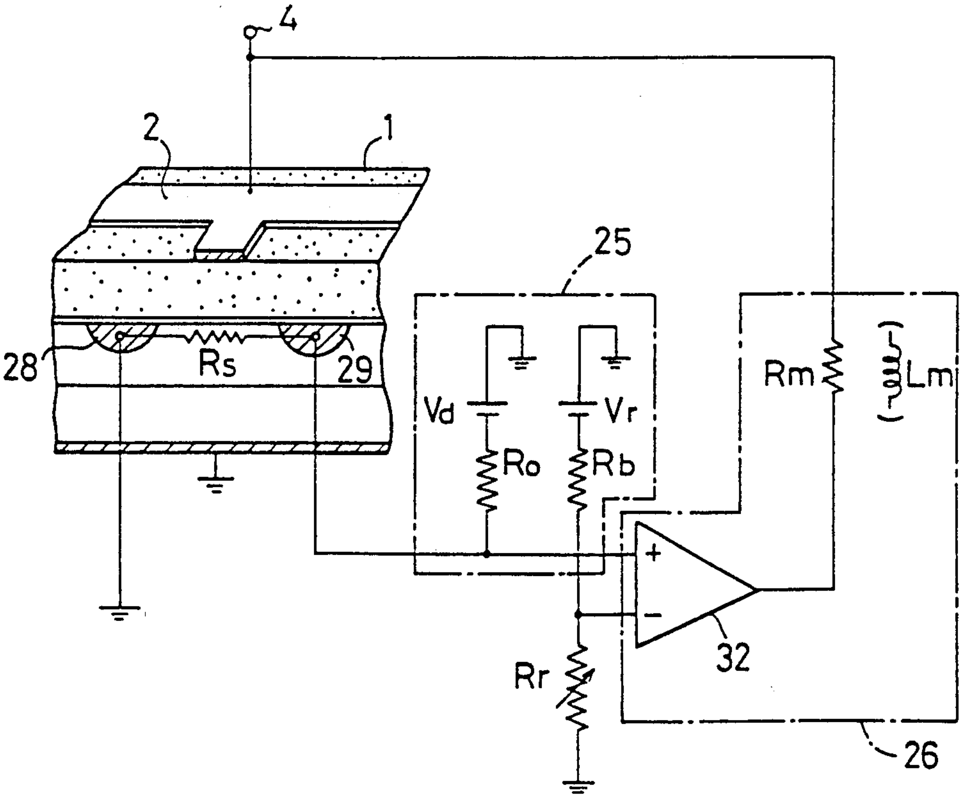
FIG. 19B shows a circuit diagram of the bias circuit employable with the convolver of the present invention.

FIG. 19B shows a circuit for controlling the bias voltage to be applied to the convolver 1 in which the MISFET, such as shown in FIGS. 10, 15 and 17, is utilized. The source 28 of the MISFET is grounded and the drain 29 is connected to the resistance "Rb". If the semi-conductor layer 19 of the convolver 1 is N-type material, the voltage "Vd" and "Vr" are polarized negative. If P-type material is used for the semi-conductor layer 19, the voltage "Vd" and "Vr" are polarized positive. Further, the amplifier Amp. 23 has its "+" input connected to the junction of surface resistance "Rs" and "Ro", and its "−" input connected to the junction of "Rr" and "Rb".

Figure 20:
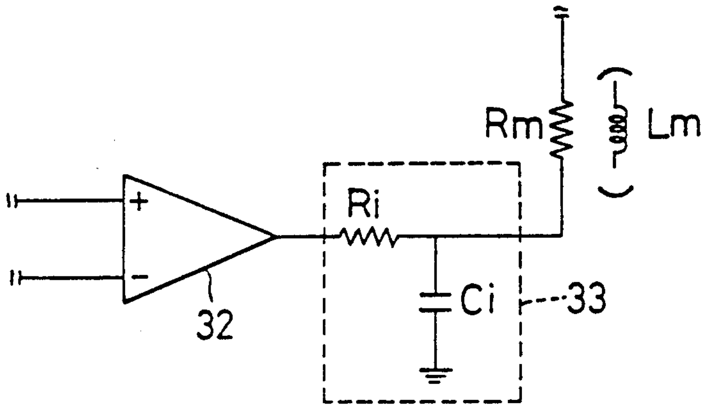
FIG. 20 shows a circuit diagram of a modified embodiment according to the present invention.

As described previously, it is necessary to make the gain of the amplifier "Amp." 32 sufficiently large. Therefore, as shown in FIG. 20, it is preferable to provide an integrating circuit 33 containing a serial resistance "Ri" and a parallel capacitance "Ci" between the output of the amplifier Amp. 32 and the gate electrode 2 of the convolver 1. Such a circuit avoids undesirable electric oscillation due to the large gain of the amplifier "Amp." 32.

Figure 1:
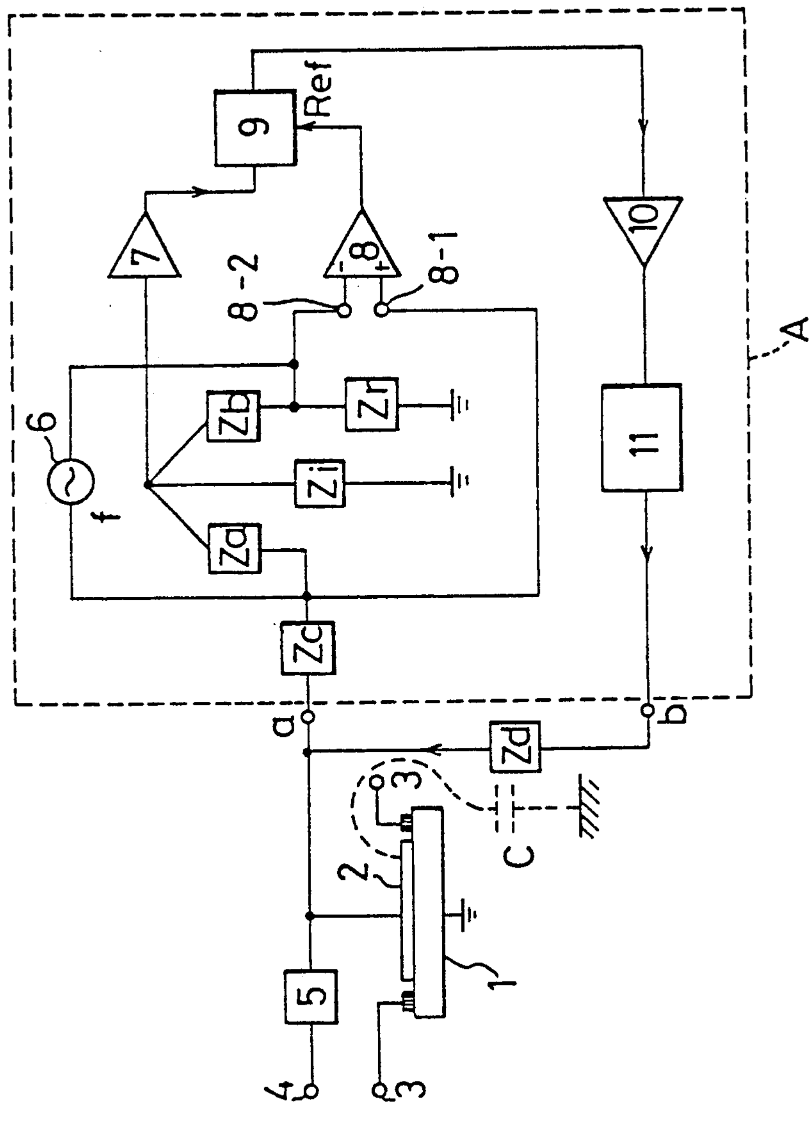
FIG.1 Prior Art
FIG. 1 shows a block diagram of a conventional bias circuit for applying bias voltage to a SAW convolver.
Figure 2:
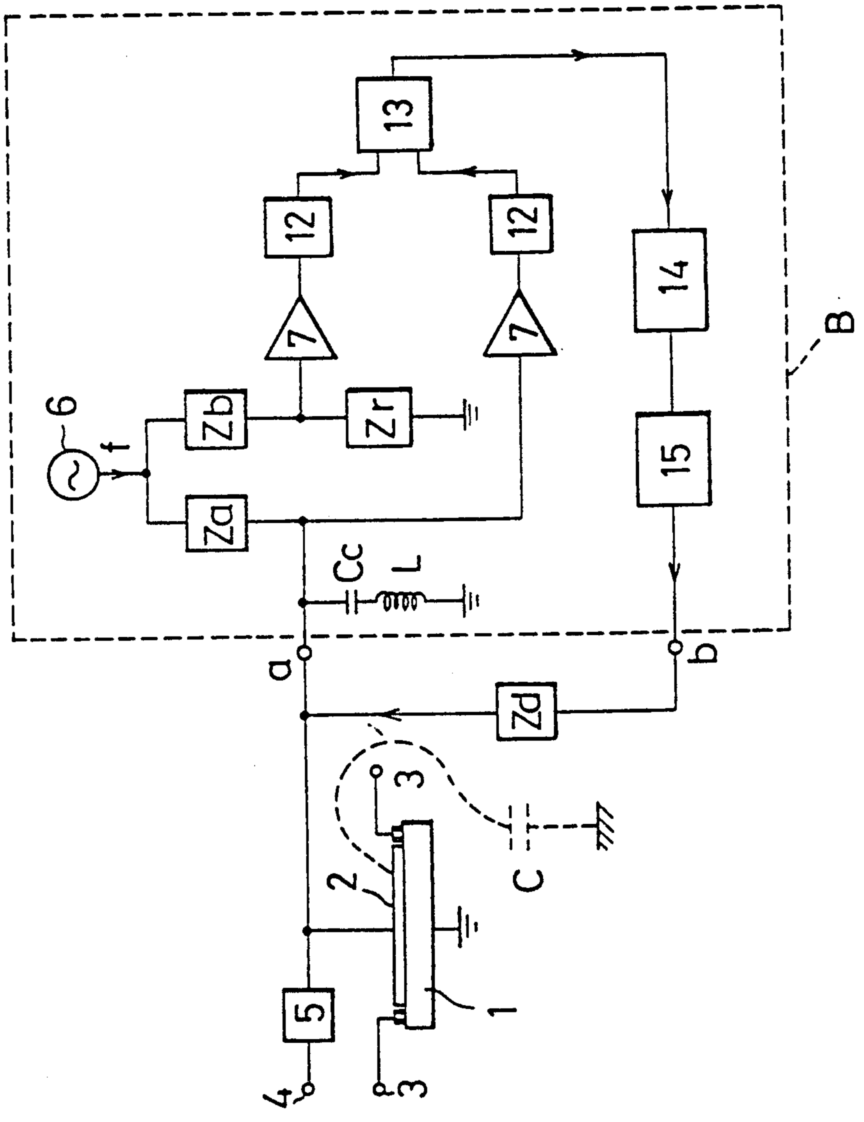
FIG.2 Prior Art
FIG. 2 shows a block diagram of another conventional bias circuit for applying bias voltage to a SAW convolver.
Figure 3:
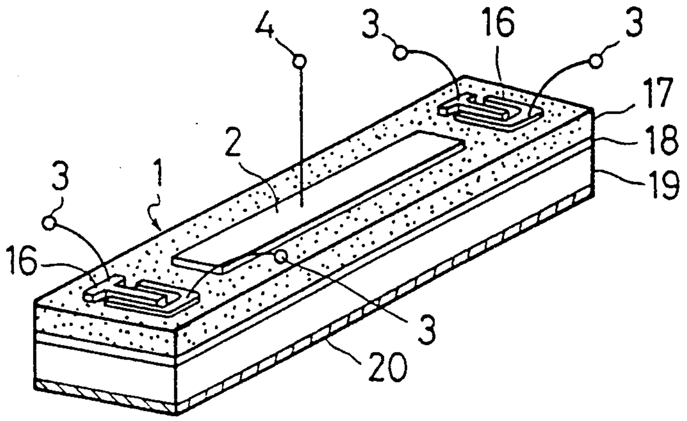
FIG.3 Prior Art
FIG. 3 shows a perspective view of the convolver to which the bias voltage is applied by means of the bias circuits shown in FIGS. 1 and 2.

As described previously, in the present invention, the circuits for applying the bias voltage to the convolver is arranged to be operated with a simple structure, and to be driven only by DC voltage. Therefore, it is not necessary to provide the prior-art elements of oscillator 6, phase detector 9, phase comparator 13 and so forth as shown in FIGS. 1 and 2. As a result a bias circuit according to the present invention is simple, and its power consumption is small.

Since the circuit according to the present invention is driven by DC voltage, the output signal from the convolver is not undesirably modulated by the AC signal.

Further, the circuits according to the present invention comprise simple structure as shown in FIGS. 19A and 20. Therefore, these circuits are suitable for fabrication in solid state devices. In other words, it is easy to produce an IC including features of these circuits. Especially, when the resistance "Rm" is used instead of the coil "Lm", all of the elements making up the circuits according to the present invention can be produced as a single IC circuit integrated with the convolver 1. However, reference resistance 24 must be placed outside the IC if adjustment of the convolution efficiency is desired.

Figure 21:
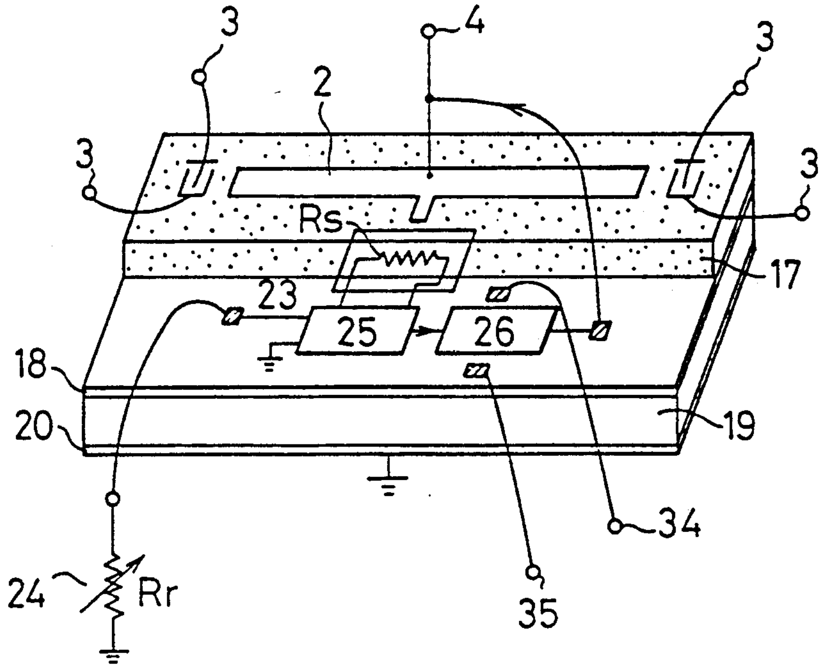
FIG. 21 shows one arrangement of the convolver according to the present invention in which the bias circuit is included therein.

FIG. 21 shows one embodiment of the convolver according to the present invention in which all of the elements except the reference resistance 24 are included on an integrated circuit. A pair of voltage input terminals 34, 35 apply positive and negative voltage to the amplifier "Amp." 32. If it is not necessary to permit adjustment of the convolution efficiency, the reference resistance "Rr" may also be included in the integrated circuit of the convolver 1.

This invention is not restricted to the above described embodiment, but further modification may be made without departing from the spirit of the present invention. For example, in the present invention, "AIN" and so forth can be used as a material of the piezoelectric layer instead of "ZnO", "SiNx" is used as the insulator material. Also, "GaAs" can be used as the semi-conductor layer material. In order to obtain high convolution efficiency, it is preferable to employ the ZnO/SiO2/n-Si structure. Further, it is preferable to employ an overlapped structure for the semi-conductor layer, i.e., the low-concentration semi-conductor epitaxial layers and high-concentration semi-conductor substrate structure.

As described above, according to the present invention, it is possible to provide a SAW convolver and a bias circuit therefor respectively arranged with a simple structures and having low power consumption. Further, these circuits are suitable for solidification and miniaturization, therefore, it is possible to produce an IC having features of these circuits.

The SAW convolver according to the present invention is generally applicable to devices in which a convolver is used. For example, it can be employed in a so-called SSC (Spread Spectrum Communication) system, a correlator, a radar, an image processing system, a Fourier transformer and so on.

Figure 22:
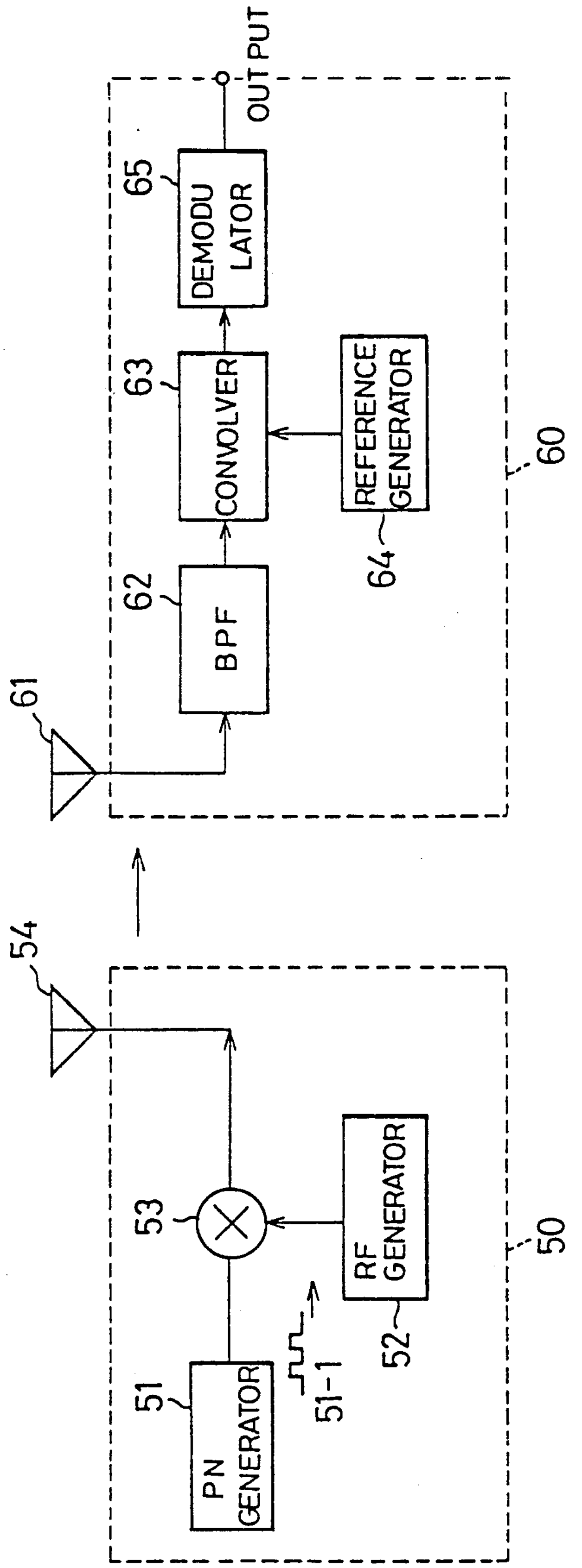
FIG. 22 shows a block diagram of a SSC (Spread Spectrum Communications) system in which the convolver according to the present invention is employed.

FIG. 22 shows a block diagram of a so-called DS (Direct Sequence) type SSC (Spread Spectrum Communication) system to which the convolver according to the present invention can be applied. The principle of the SSC system employing a convolver according to the present invention as a correlation unit will be described hereinafter.

The SSC system comprises a transmitter 50 for transmitting radio frequency wave modulated by a so-called PN (Pseudo Noise) signal 51-1 generated by the PN generator 51. An RF (Radio Frequency) generator in the transmitter 50 generates an RF signal to be transmitted. The RF signal is fed to a modulator 53 such as a DBM (Double Balanced Modulator). The RF signal fed to the modulator 53 has been modulated in advance by a desired signal to be communicated, for example, AF (Audio Frequency). The RF signal is modulated by the PN signal in the modulator 53 and transmitted through an antenna 54 to a receiver 60.

The receiver 60 comprises an antenna 61 for receiving the RF wave from the transmitter 50, a BPF (Band Pass Filter) 62 for selectively passing the RF signal received by the antenna 61. The BPF 62 has a passband effective to pass the desired frequency band and to cut off other frequencies. A reference signal generator 63 generates a signal having a predetermined relation, for example the same wave-form signal with each other, with the PN signal from the PN generator 51. A SAW convolver 63, according to the present invention, is employed as a correlator for executing correlation between the PN signal modulating the received RF signal and the reference signal.

When the correlation is executed with high accuracy, the RF signal modulated by the PN signal 51-1 is demodulated by a demodulator 65. The RF signal is further demodulated by a well-known manner, for demodulating the desired signal to be communicated and output through an output terminal.

In the above described SSC system, the convolver according to the present invention can be employed, the SSC system can take advantage of the simply structured correlator.

What is claimed is:

1. A convolver comprising:
a piezoelectric film layer;
an insulating layer affixed to said piezoelectric film layer;
a semi-conductor layer affixed to said insulating layer;
a gate electrode on said piezoelectric film layer;
means for measuring a surface resistance of a surface of said convolver;
said means for measuring a surface resistance includes a MISFET;
a gate of said MISFET forms a part of said gate electrode of said convolver;
means for adjusting said surface resistance to a surface resistance related to a condition of said piezoelectric film layer; and
said means for adjusting includes means for adjusting measurement of a resistance between a source and a drain of said MISFET.

2. The convolver according to claim 1, wherein a conduction type of said source and drain of said MISFET is complementary to a conduction type of said semi-conductor layer.

3. The convolver according to claim 2, further comprising:
another semi-conductor layer;
said another semi-conductor layer having a conduction type that is complementary to said conduction type of said semi-conductor layer between said semi-conductor layer and said insulator layer; and
a thickness of said another semi-conductor layer being small compared to a thickness of said semi-conductor layer.

4. Apparatus comprising:
a convolver;
said convolver includes a piezoelectric film layer, an insulator layer, a semi-conductor layer, and a gate;
a surface resistance measurement part in said convolver located close to a part of said convolver having an electric potential similar to said gate;
means for making a resistance value of said surface resistance measurement part changeable by a bias voltage applied thereto;
a resistance comparing circuit for comparing said resistance value and a reference resistance;
said resistance comparing circuit includes a first resistor in said surface resistance measurement part, a second resistor having a predetermined value, a first DC voltage source connected in series with said first resistor, and a second DC voltage source connected in series with said second resistor;

a bias generating circuit, responsive to said resistance comparing circuit, for generating said bias voltage; and means for controlling said bias voltage to a value effective for setting a surface resistance value of said surface resistance measurement part to a desired value.

5. Apparatus according to claim 4, wherein said bias generating circuit includes:

a differential amplifier having first and second inputs;

said first input being connected to said first resistor; and one of a resistor and an inductor between an output of said differential amplifier and said gate of said convolver.

6. Apparatus according to claim 5, further comprising an integrating circuit in series with an output of said amplifier.

7. Apparatus according to claim 6, wherein said integrating circuit includes:

a resistance in series with said output; and a capacitor connected between an output end of said resistance and ground.

8. Apparatus according to claim 5, wherein a resistance value of said second resistor is variable.

9. Apparatus according to claim 5, wherein an output voltage of said first DC voltage source is substantially equal to an output voltage of said second DC voltage source.

* * * * *